United States Patent [19]

Taranov et al.

[11] 4,037,150

[45] July 19, 1977

[54] METHOD OF AND APPARATUS FOR ELIMINATING THE EFFECT OF NON-EQUIPOTENTIALITY VOLTAGE ON THE HALL VOLTAGE

[76] Inventors: Sergei Glebovich Taranov, Brest Litovsky Prospekt, 2, kv. 107; Voldmir Vasilievich Braiko, ulitsa Vernadskogo, 75, kv. 18a; Anatoly Danilovich Nizhensky, ulitsa Kapitanovskaya, 14, kv. 25/3; Vladimir Petrovich Belousov, ulitsa Vernadskogo, 61, kv. 3/1, all of Kiev; Dmitry Vasilievich Kovalchuk, ulitsa Chekistov, 4a, kv. 6, Zhitomir; Isaak Pavlovich Grinberg, ulitsa Gorkogo, 42, kv. 12, Zhitomir; Eugeny Eustafievich Laschuk, ulitsa Chekistov, 4a, kv. 7, Zhitomir; July Modestovich Panchishin, Brest-Litovsky Prospekt, 39; Jury Trofimovich Chigirin, Brest-Litovsky Prospekt, 102, both of Kiev, all of U.S.S.R.

[21] Appl. No.: 571,599

[22] Filed: Apr. 25, 1975

Related U.S. Application Data

[63] Continuation of Ser. No. 365,155, May 30, 1973, abandoned.

[51] Int. Cl.$^2$ .......................................... G01R 33/06
[52] U.S. Cl. .................................... 324/45; 323/94 H
[58] Field of Search ............ 324/45, 117 H; 307/309; 323/94 H; 338/32 H

[56] References Cited

U.S. PATENT DOCUMENTS

| 3,370,241 | 2/1968 | Saraga | 324/45 |
|---|---|---|---|
| 3,416,010 | 12/1968 | Kuhnlein et al. | 324/45 |
| 3,555,310 | 1/1971 | Haeusler | 307/309 |
| 3,886,446 | 5/1975 | Laranov et al. | 324/45 |

OTHER PUBLICATIONS

Solid State Electronics; Pergamon Press; 1969; vol. 12, pp. 201–208; printed in G. Brit.

*Primary Examiner*—Robert J. Corcoran

[57] ABSTRACT

A method of eliminating the effect of non-equipotentiality voltage on the Hall voltage based on the non-reciprocal behavior of a Hall generator whereby a Hall generator or cascade-connected Hall generators are energized with current alternately through one of two pairs of opposite electrodes, while the output signal is obtained from across the other pair of electrodes or a Hall generator or cascade-connected Hall generators are energized through each pair of opposite electrodes with currents equal in magnitude but differing in frequency, while the output signal is obtained from the same pair of electrodes, and then the true value of the voltage of the Hall generator or of the cascade-connected Hall generators is assessed from the arithmetic mean of the magnitudes of the converted signals. An apparatus embodying the above method wherein in one case the pairs of opposite electrodes of a Hall generator are connected through a switch with a supply source and with a Hall voltage indicator and in the other case the pairs of opposite electrodes of a Hall generator are connected to the respective supply sources operating at frequencies of which one is an even multiple of the other, the same pairs of opposite electrodes being connected through phase-sensitive detectors to the input of an adder connected to the Hall voltage indicator.

An apparatus embodying the above method for cascade-connected Hall generators comprises a supply voltage former of the second Hall generator, said former being connected to the output of said switch of electrodes of the first Hall generator and to a supply source, and an additional switch with which said pairs of opposite electrodes of the second Hall generator are connected in turn now to the supply voltage former and now to the Hall voltage indicator which is connected to the outputs of said additional switch.

2 Claims, 10 Drawing Figures

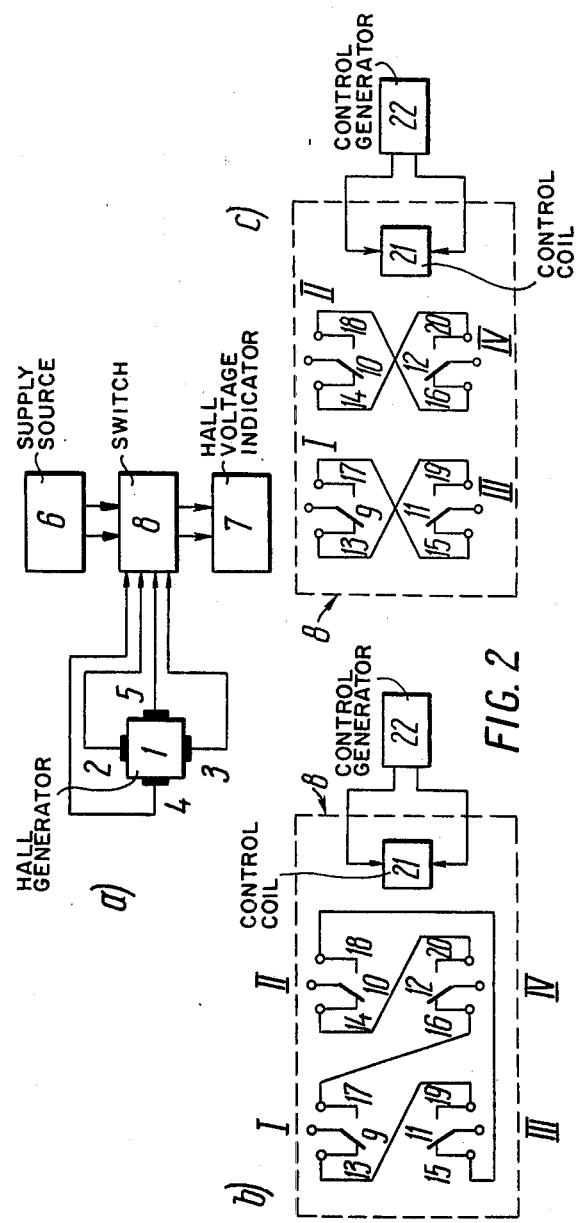
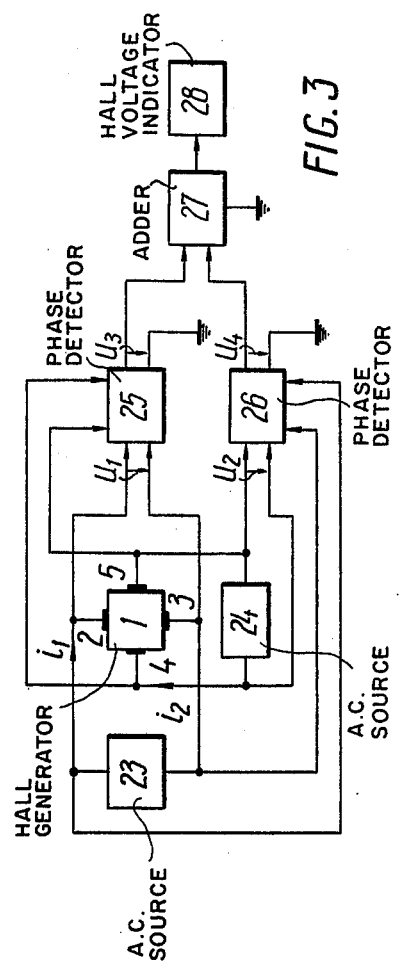
FIG. 2
FIG. 3

METHOD OF AND APPARATUS FOR ELIMINATING THE EFFECT OF NON-EQUIPOTENTIALITY VOLTAGE ON THE HALL VOLTAGE

This application is a continuation filed Apr. 25, 1975 of parent application Ser. No. 365,155 filed May 30, 1973 and abandoned May 20, 1975.

The present invention relates to electrical measurements, particularly to methods of, an apparatus for eliminating the effect of non-equipotentiality voltage on the voltage of a Hall generator and on the voltage of cascadeconnected Hall generators, and may be utilized in devices depending for their operation on the Hall effect.

In the prior art there are methods of eliminating the effect of non-equipotentiality voltage on the Hall voltage, which may be arbitrarily divided into three classes. Methods in one class are based on balancing the non-equipotentiality voltage of a Hall generator in the absence of a magnetic field in much the same way as the out-of-balance voltage would be compensated in a four-arm bridge. Methods in another class are based on cancelling out the non-equipotentiality voltage by means of an additional magnetic field applied to the Hall generator. In the third class are methods based on balancing the non-equipotentiality voltage by means of an opposing voltage applied to the output circuit of the Hall generator.

In the case of cascade-connected Hall generators similar methods are used to eliminate the effect of non-equipotentiality voltage on the voltage of each Hall generator.

A disadvantage of the prior-art methods is a very low accuracy with which the effect of non-equipotentiality voltage on a Hall voltage is eliminated, which is due to variations in the non-equipotentiality voltage being compensated, resulting from time and temperature instability of the Hall generator and of the compensating circuit itself.

Another disavantage of prior-art methods is that it is impossible to determine the true magnitude of a magnetic field acting upon the Hall generator, since in many cases the non-equipotentiality voltage cannot be separated from the Hall voltage proper.

A further disadvantage of prior-art methods is that they take much time to compensate the non-equipotentiality voltage, which fact handicaps or makes altogether impossible their application for measuring and recording magnetic and electric characteristics which vary faster than the nonequipotentiality voltage can be balanced out. This is especially true of Hall generators using an alternating current, since in such cases the non-equipotentiality voltage is a complex quantity, and, therefore, has in-phase and quadrature components, that must be taken care of.

In the case of cascade-connected Hall generators the time required for compensating the non-equipotentiality voltage and the number of adjustments increase correspondingly.

A still further disadvantage of prior-art methods is that they do not permit automation of the very process of balancing the non-equipotentiality voltage when a magnetic field is acting on the Hall generator and on cascade-connected Hall generators.

A disadvantage common to the last two classes of methods is that one has to use additional sources of, respectively, magnetic and electric fields so as to produce balancing voltages. A further disadvantage of the last two classes of methods is that variations in the supply current of the Hall generator will inevitably upset the balancing of nonequipotentiality voltage. This disadvantage is especially evident in the case of cascade-connected Hall generators since the output voltage of the preceding generator is used to supply the next generator and varies depending on the magnitude of the magnetic field being measured.

In the prior art there are also apparatuses for eliminating the effect of non-equipotentiality voltage on the Hall voltage, embodying the above methods. Thus, for example, to embody the first class of methods, in the elementary case, use is made of a variable resistor placed between adjacent electrodes of the Hall generator or between adjacent electrodes of each of cascade-connected Hall generators, and the resistor is adjusted so that the non-equipotentiality voltage is fully balanced out, which corresponds to restoring to balance a bridge circuit equivalent to a Hall generator.

A disadvantage of these prior-art apparatuses is their instability with time and temperature. Another disadvantage is that the balancing elements require careful adjustment in the course of measurement and recording, which involves a further waste of time. Last but not least they are inconvenient to handle and cannot be used in digital instruments since they are far from meeting the accuracy and speed-of-response requirements of the latter.

The object of the present invention is to eliminate the effects of the non-equipotentiality voltage on the voltage of a Hall generator and on the voltage of cascade-connected Hall generators.

With this and other objects in view in a method of eliminating the effect of non-equipotentiality voltage on the voltage of a Hall generator, based on the non-reciprocal behaviour of a Hall generator, according to the invention, the Hall generator is energized with current alternately through one of the two pairs of opposite electrodes, the output signal is obtained from across the other pair of electrodes and the true magnitude of the Hall voltage is assessed from the arithmetic means of the magnitudes of at least two successive output signals. With the same object in view in a method of eliminating the effect of non-equipotentiality voltage on the Hall voltage based on the non-reciprocal behaviour of a Hall generator, according to the invention, the Hall generator is energized through each pair of opposite electrodes with currents which are equal in magnitude but different in frequency, the output signals being obtained from across the same pairs of electrodes, separated in frequency and detected, and the true magnitude of the Hall voltage assessed from the arithmetic mean of the magnitudes of the two converted signals.

An apparatus embodying one method wherein one pair of opposite electrodes of a Hall generator is connected to a supply source and the other pair, to a Hall voltage indicator, according to the invention, comprises a switch with which said pairs of opposite electrodes are connected in turn now to the Hall voltage indicator and now to the supply source.

The switch of Hall generator electrodes in this apparatus is preferably of the electromechanical type with at least two pairs of change-over contacts arranged so that the movable contacts of one pair are connected to a supply source, the movable contacts of the other pair are connected to a Hall voltage indicator and each stationary n.c. contact of one pair is connected to the respective stationary n.o. contact of the other pair, and to one of the respective electrodes of the Hall generator, the control circuit of the switch being connected to a control generator.

An apparatus embodying another method wherein one pair of opposite electrodes of a Hall generator is connected to a supply source, according to the invention, comprises an additional supply source operating at a frequency which is an even multiple of the frequency of abovementioned source and connected to the other pair of opposite electrodes, and two phase-sensitive detectors, the inputs of each of said detectors being connected to the respective pairs of opposite electrodes, and their outputs, to the input of an adder which is connected to a Hall voltage indicator.

The apparatus may comprise another Hall generator with two pairs of opposite electrodes, an additional switch and a supply voltage shaper of this generator connected to a supply source through the switch of the electrodes of the first Hall generator, the shaper output being coupled to the additional switch with which said pairs of opposite electrodes of the second Hall generator are connected in turn now to the supply voltage shaper and now to a Hall voltage indicator which is connected to the outputs of the additional switch.

In the apparatus which comprises another Hall generator with two pairs of opposite electrodes and an additional supply voltage shaper for this generator each pair of its opposite electrodes is preferably connected to the respective phase-sensitive detector and to the respective output of the additional supply voltage shaper, some of the inputs of which are coupled through respective frequency selectors to the pairs of opposite electrodes of the first Hall generator while the other inputs of said additional shaper are connected to said power sources.

The invention will be more fully understood from the following description of a preferred embodiment when read in connection with the accompanying drawings, in which:

FIGS. 1a and 1b diagrammatically represent a Hall generator as a non-reciprocal four-terminal network used in an apparatus for eliminating the effect of non-equipotentiality voltage on the Hall voltage, according to the invention;

FIG. 2a is a block diagram of an apparatus for eliminating the effect of non-equipotentiality voltage of the voltage of a Hall generator, according to the invention;

FIGS. 2b and 2c show two possible arrangements of switch contacts in an apparatus for eliminating the effect of nonequipotentiality voltage on the voltage of a Hall generator, according to the invention;

FIG. 3 is a block diagram of an apparatus for eliminating the effect of non-equipotentiality voltage on the voltage of a Hall generator with output signals separated in frequency, according to the invention;

Figure 1:
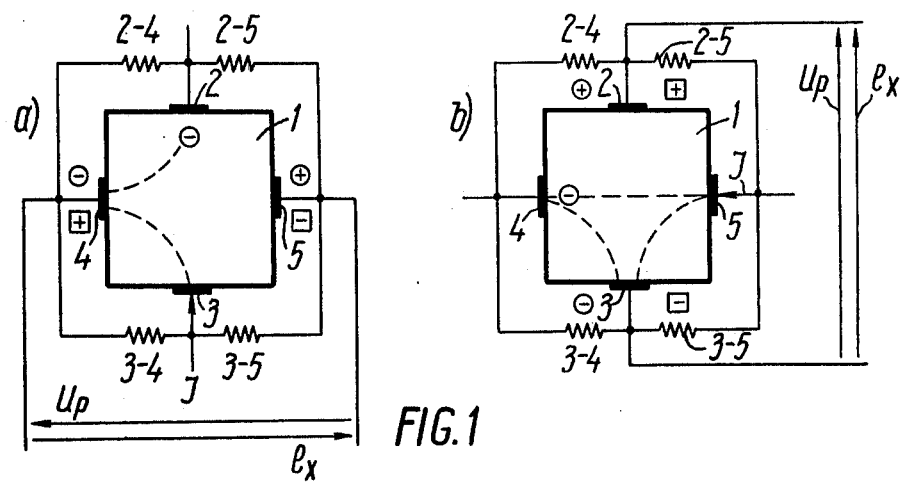

When a Hall generator 1 is energized with a current I through one of two pairs of opposite electrodes, say, 2 and 3 (FIG. 1a), and there is no magnetic field applied to the generator 1 a voltage develops across the other pair of electrodes 4 and 5 due to the fact that said electrodes are connected to non-equipotential points on the wafer of the generator 1. This voltage is commonly referred to as non-equipotentiality voltage symbolized by $U_p$. The magnitude of $U_p$ depends on the resistivity of the generator material and is proprotional to the magnitude of supply current.

As regards the non-equipotentiality voltage, the Hall generator is a reciprocal circuit (its equivalent circuit may take the form of a conventional four-arm bridge), while as regards the Hall voltage, $e_H$, it is non-reciprocal. The method of eliminating the effect of non-equipotentiality voltage on the Hall voltage will be discussed below with reference to FIG. 1a, which diagrammatically shows a square isotropic Hall generator using similar electrodes, which functions as follows.

The generator is energized with a current I through opposite electrodes 2–3 in the direction from the electrode 3 to the electrode 2. The dotted line represents the path of a negative charge carrier (electron). Assuming that the magnetic induction vector lies in the plane of the drawing, then, according to the right-hand rule, an electrode 4 is negative and an electrode 5 is positive (the respective polarity signs are encircled).

Let the non-equipotentiality voltage, $U_p$, be in the opposite direction (its polarity signs are shown in squares). This is so because, as follows from the bridge equivalent circuit of the Hall generator, the resistance of an arm $r_{2-5}$ then, according to the right-hand rule, an electrode 4 is negative and an electrode 5 is positive (the respective polarity signs are encircled).

Let the non-equipotentiality voltage, $U_p$, be in the opposite direction (its polarity signs are shown in squares). This is so because, as follows from the bridge equivalent circuit of the Hall generator, the resistance of an arm $r_{2-5}$ is lower than that of an arm $r_{2-4}$ while the other two arms have the same resistance ($r_{3-4} = r_{3-5}$).

Now assume that, with the same direction of the magnetic induction vector, the generator 1 is energized with the current I through the electrodes 4–5 in the direction from the electrode 5 to the electrode 4, that is in the same direction in which the hall voltage acts in the first case. Then, according to FIG. 1b, the Hall voltage across the electrodes 2–3 (the polarity signs of the Hall voltage are encircled in the figure) will act in a direction opposite to that of the supply current in the first case (see FIG. 1a), which is a convincing proof of the fact that the Hall generator is a non-reciprocal circuit. Sincer $r_{2-5} < r_{2-4}$, the electrode 2 is at a higher potential than the electrode 3, and the non-equipotentiality voltage, $U_p$, has the same polarity as the Hall voltage, $e_{H1}$. Since in the second case the direction of current flow is different from the direction in which the non-equipotentiality voltage acts in the first case, it follows that, as regards the non-equipotentiality voltage, the Hall generator is a reciprocal circuit. Thus, in the first case the magnitude of the output voltage, $|U_1|$, of the generator is $$|U_1| = |e_H - U_p| \quad (1)$$

and in the second case $$|U_2| = |e_H + U_p| \quad (2)$$

Adding together the two voltages will give a resultant voltage, the average value of which is proportional only to the Hall voltage and is independent of the non-equipotentiality voltage, provided that $|e_H| > |U_p|$. According to the rules of algebraic addition of moduli, if $|e_H| < |U_p|$, the average value of the sum of these two signals will be proportional to the non-equipotentiality voltage, rather than to the Hall voltage, that is:

$$\frac{|U_1| + |U_2|}{2} = \frac{|e_H - U_p| + |e_H + U_p|}{2} = \frac{-|e_H| + |U_p| + |e_H| + |U_p|}{2} = U_p \qquad (3)$$

Because of this when $|e_H| < |U_p|$, the magnitudes of the output voltages have to be subtracted.

Theoretical and experimental studies have shown that for an isotropic Hall generator, modules $|e_H|$ and $|U_p|$ are identically equal in both cases examined above and the phase shift between them is either zero or 180° (cf. "Solution of the Electric Hall Field in a Germanium Gyarator" by R. F. Wick, Journal of Applied Physics, Vol 25, No. 25, 1954).

In the case of two cascade-connected Hall generators similar to the one discussed above, as in the former case, the magnitude of the output voltage of the cascade connection is:

$$|U_I| = |(e_{H1} - U_{p1}) B k_1 - U_{p2}| = |(e_{H1} - U_{p1})k - U_{p2}| \qquad (4)$$

and in the latter case it is:

$$|U_{II}| = |(e_{H1} + U_{p1})k + U_{p2}| \qquad (5)$$

where
$e_{H1}$— voltage of the first Hall generator;
$U_{p1}$, $U_{p2}$— non-equipotentiality voltages of the first and second generators;
B—measured magnetic induction;
$k_1$— conversion coefficient of the second generator;
$k = k_1 B$.

Adding together these two voltages will give a resultant voltage, the mean value of which is proportional only to the Hall voltage, being independent of the non-equipotentiality voltages of the cascade-connected generators provided that $|e_{H1}| > |U_{p1}|$ and $|e_{H2}| = |(e_{H1} \pm U_{p1})k| > |U_{p2}|$, where $e_{H2}$ is the Hall voltage of the second generator.

According to the rules of algebraic addition of moduli, if $|e_{H1}| < |U_{p1}|$ and $|e_{H2}| > |U_{p2}|$; $|e_{H1}| > |U_{p1}|$ and $|e_{H2}| < |U_{p2}|$; $e_{H1}| < |U_{p1}|$ and $|e_{H2}| < |U_{p2}|$ -the average value of the sum of these two signals will not be proportional to the Hall voltage. For three different cases we obtain:

$$\frac{|U_I'| + |U_{II}'|}{2} = \frac{|(e_{H1} - U_{p1})K - U_{p2}| + |(e_{H1} + U_{p1})K + U_{p2}|}{2} =$$
$$= \frac{-|e_{H1}|K + |U_{p1}|K - |U_{p2}| + |e_{H1}|K + |U_{p1}|K + |U_{p2}|}{2} = U_{p1}K \qquad (6)$$

$$\frac{|U_I''| + |U_{II}''|}{2} = \frac{|(e_{H1} - U_{p1})K - U_{p2}| + |(e_{H1} + U_{p1})K + U_{p2}|}{2} =$$
$$= \frac{|U_{p2}| - |e_{H1}|K + |U_{p1}|K + |e_{H1}|K + |U_{p1}|K + |U_{p2}|}{2} = U_{p1}K + U_{p2} \qquad (7)$$

$$\frac{|U_I'''| + |U_{II}'''|}{2} = \frac{|(e_{H1} - U_{p1})K - U_{p2}| + |(e_{H1} + U_{p1})K + U_{p2}|}{2} =$$
$$= \frac{|U_{p2}| - |U_{p1}|K + |e_{H1}|K + |e_{H1}|K + |U_{p1}|K + |U_{p2}|}{2} = e_{H1}K + U_{p2} \qquad (8)$$

Therefore, if $|e_{H1}| < |U_{p1}|$ and $|e_{H2}| > |U_{p2}|$, the magnitudes of the output voltages of the first generator must be subtracted and the magnitudes of the output voltages of the second generator must be added; if $|e_{H1}| > |U_{p1}|$ and $|e_{H2}| < |U_{p2}|$, the magnitude of the output voltages of the first generator must be added and the magnitudes of the output voltages of the second generator must be subtracted; if $|e_{H1}| < |U_{p1}|$ and $|e_{H2}| < |U_{p2}|$, the magnitudes of the output voltages of the first generator must be subtracted and the magnitudes of the output voltages of the second generator must be also subtracted.

When a Hall generator is energized with an alternating current at a fixed frequency all that has been said above holds for instantaneous voltages and currents. Owing to the non-reciprocal behavior of the Hall generator, when the pairs of opposite electrodes alternately change places, the phase between the Hall voltage and the non-equipotentiality voltage changes by 180°. If in the first position of the electrodes the generator voltage at any time is $$U_1 = (E_H - V_p)\sin\omega t \qquad (9)$$

and in the second position $$U_2 = (E_H + V_p)\sin\omega t \qquad (10)$$

where $E_H$ and $V_p$ are the peak values of the Hall voltage and of the non-equipotentiality voltage, respectively, and $\omega$ is the angular frequency of the supply current.

If $E_H > V_p$, the arithmetic mean of the magnitudes of these signals will be proportional only to the Hall voltage.

In the case of cascade-connected Hall generators similar to the one discussed above, in the first position the output voltage of the cascade connection at any time is $$U_I = (E_{H1} - V_{p1})k\sin\omega t - V_{p2}\sin\omega t. \qquad (11)$$

and in the second position $$U_{II} = (E_{H1} + V_{p1})k\sin\omega\, t + V_{p2}\sin\omega t \qquad (12)$$

where $E_{H1}$, $E_{H2}$, $V_{p1}$, $V_{p2}$ are the peak values of the Hall voltage and of the non-equipotentiality voltage of the first and second generators, $e_{H2} = (E_{H1} \pm V_{p1})\ k\sin\omega_0 t = E_{H2}\sin\omega_0 t$.

When $E_{H1} > V_{p1}$ and $E_{H2} > V_{p2}$ the arithmetic mean of the magnitudes of these signals will be proportional only to the Hall voltage.

If the generator 1 is energized through each pair of opposite electrodes (2–3 and 4–5) with alternating currents equal in magnitude and differing in frequency, then, on the basis of the foregoing one may write the voltage $v_1$ obtained from across one pair of opposite electrodes will be $$U_1 = (E_H - V_p)\sin\omega_1 t + V\sin\omega_2 t \qquad (13)$$

and the voltage $U_2$ obtained from across the other pair of opposite electrodes will be $$U_2 = (E_H^- + V_p)\sin\omega_2 t + V'\sin\omega_1 t \qquad (14)$$

where $V'$ and $V''$ are the magnitudes of the voltage drops across the respective pairs of opposite electrodes due to the currents at angular frequencies $\omega_2$ and $\omega_1$. By separating these voltages according to frequency ($\omega_1$ in the case of the former and $\omega_2$ in the case of the latter) with subsequent detection it is possible to assess the true value of the Hall voltage from the arithmetic mean of the magnitudes of the two converted signals, when $E_H > V_p$.

In the case of cascade-connected Hall generators similar to the one discussed above the voltage $U_I$ obtained from across one pair of opposite electrodes of the second Hall generator will be $$U_I = (E_{HI} - V_{p1})k\sin\omega_1 t - V_{p2}\sin\omega_1 t + V'_2\sin\omega_2 t \qquad (15)$$

and the voltage $U_{II}$ obtained from across the other pair of opposite electrodes of the second Hall generator will be $$U_{II} = (E_{H1} + V_{p1})k\sin\omega_2 t + V_{p2}\sin\omega_1 t + V''_2\sin\omega_1 t \qquad (16)$$

where $V'_2$ and $V''_2$ are the magnitudes of the voltage drops across each pair of opposite electrodes of the second generator due to the currents at angular frequencies $\omega_2$ and $\omega^1$.

The output voltages $U_1$ and $U_2$ of the first and second pairs of opposite electrodes of the first Hall generator, equal to $$U_1 = (E_{H1} - V_{p1})\sin\omega_1 t + V'_1\sin\omega_1 t \qquad (17)$$

$$U_2 = (E_{H1} + V_{p1})\sin\omega_2 t + V''_1\sin\omega_2 t \qquad (18)$$

are respectively separated according to the frequency $\omega_1$ and $\omega_2$ and applied to the opposite pairs of electrode of the second Hall generator; $U'_1$ and $U''_1$ are the magnitudes of the voltage drops across each pair of opposite electrodes of the first Hall generator due to the currents at angular frequencies $\omega_2$ and $\omega_1$.

By separating the output voltages of the second generator according to frequency ($\omega_1$ in the case of the former and $\omega_2$ in the case of the latter) with subsequent detection, it is possible to assess the true value of the Hall voltage of cascade-connected generators from the arithmetic mean of the magnitudes of the two converted signals when $E_{H1} > U_{p1}$ and $F_{H2} > U_{p2}$.

Thus, the effect of non-equipotentiality voltage on the voltage of a Hall generator and on the voltage of cascade connected Hall generators can be fully eliminated by separating the output signals according to their frequency and duration, from two pairs of opposite electrodes of one Hall generator or, in the case of a cascade connection, of each Hall generator.

One version of an apparatus embodying the above-mentioned method for eliminating the effect of non-equipotentiality voltage on the voltage of a Hall generator comprises a Hall generator 1 (FIG. 2a), two pairs of opposite electrodes 2–3 and 4–5 connected to a supply source 6 and to a voltage indicator dicator 7 of the Hall generator 1 via a switch 8.

The switch 8 is intended for alternately connecting the pairs of electrodes 2–3 and 4–5 of the Hall generator 1 to the supply source 6 and the Hall-voltage indicator 7. The switch 8 may be any moving or static switching device: mechanical, electromechanical, electronic, etc.

As an example, FIGS. 2b and 2c show two arrangements of contacts in an electromechanical relay switch 8 comprising two pairs I–II and III–IV of change-over contacts arranged so that movable contacts 9, 10 of the pair I–II are connected to the supply source 6, movable contacts 11, 12 of the pair III–IV are connected to the Hall-voltage indicator 7 and each stationary n.c. contact 13, 14, 15, 16 of both pairs I–II and III–IV is connected to the respective stationary n.o. contact 17, 18, 19, 20 of the same pairs and to one of the respective electrodes 2–3, 4–5 of the Hall generator 1, while a control coil 21 of the relay switch 8 is connected to a control generator 22 which may comprise, for example, a conventional symmetric multivibraor to serve as a source of periodic signals for automatically controlling switch 8.

The arrangement of FIG. 2b in which the stationary n.c. contact 13 and the stationary n.o. contact 17 of the changeover contact I are connected respectively to the n.o. contact 19 of the changer-over contact III and the n.c. contact 16 of the change-over contact IV, while the stationary contacts 14, 18 of the changer-over contact II are connected to the n.o. contact 20 of the change-over contact IV and to the n.c. contact 15 of the change-over contact III, enables the output signal of the Hall generator to be inverted when the electrodes (2–3, 4–5) of the generator 1 are switched over.

The arrangement of FIG. 2c in which the stationary contacts 13, 17 and 14, 18 of the change-over contacts I and II are cross-connected respectively to the stationary contacts 15, 19 and 16, 20 of the change-over contacts III and IV does not invert the output voltage of the Hall generator 1 when its electrodes (2–3, 4–5) are switched over.

Another version of an apparatus embodying the method for eliminating the effect of non-equipotential voltage on the voltage of a Hall generator may comprise a Hall generator 1 (FIG. 3) with two pairs of opposite electrodes 2–3 and 4–5, two A.C. sources 23 and 24 with frequencies $\omega$ and $2n\omega$, where $n$ is an integer, and two phase-sensitive detectors 25, 26, the outputs of which are coupled to an adder 27 connected to a Hall-voltage indicator 28.

The function of the phase sensitive detectors 25 and 26 is to separate the signals obtained from across two pairs of opposite electrodes (2–3, 4–5) of the generator 1 in frequency and to detect them so that the true magnitude of the Hall voltage can subsequently be assessed from the arithmetic mean of the magnitudes of two converted signals, obtained wit the help of the adder 27.

Figure 4:
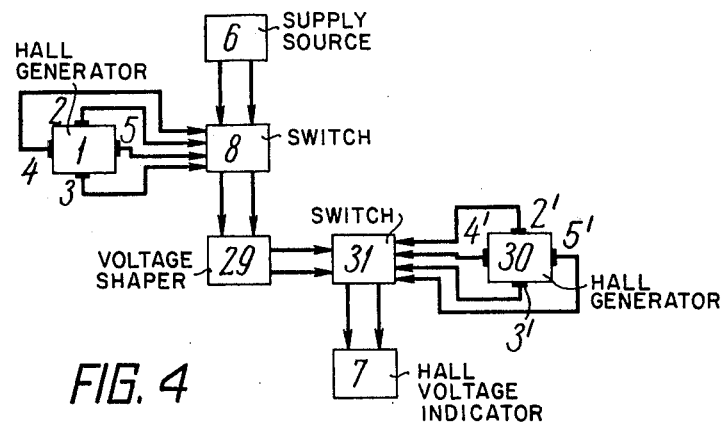
FIG. 4 is a block diagram of an apparatus for eliminating the effect of non-equipotentiality voltage on the voltage of cascade-connected Hall generators, according to the invention.

One version of an apparatus embodying the method of eliminating the effect of non-equipotentiality voltage on the voltage of cascade-connected Hall generators comprises a first Hall generator 1 (FIG. 4) with two pairs of opposite electrodes (2-3, 4-5) connected through a switch 8 to a supply source 6 and a supply voltage shaper 29 of a second hall generator 30, which is coupled to the supply source 6, the second Hall generator 30 with two pairs of opposite electrodes (2'-3',4'λ -5') connected to the supply voltage shaper 29 and to a voltage indicator 7 of the second Hall generator 30 through an additional switch 31.

Figure 5:
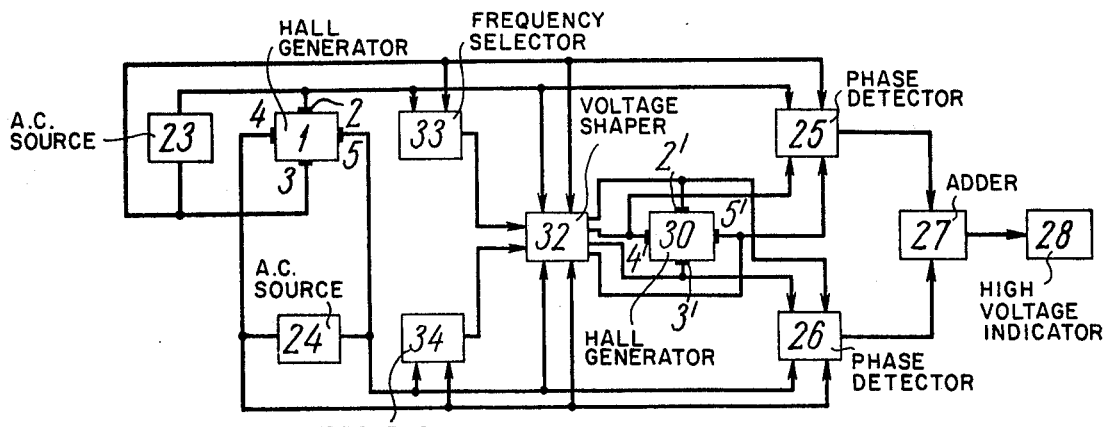
FIG. 5 is a block diagram of an apparatus for eliminating the effect of non-equipotentiality voltage on the voltage of cascade-connected Hall generators with output signals separated in frequency according to the invention.

Another version of an apparatus embodying the method of eliminating the effect of non-equipotentiality voltage on the voltage of cascade-connected Hall generators may comprise two A.C. sources 23, 24 with frequencies $\omega$ and $2n\omega$ connected to an additional supply voltage shaper 32 of the second Hall generator 30 (FIG. 5) and to the first Hall generator 1 which has two pairs of opposite electrodes (2-3, 4-5), two frequency selectors 33, 34 connected to the additional supply voltage shaper 32 of the second Hall generator 30, whose outputs are coupled to the second Hall generator 30 which has two pairs of opposite electrodes (2'-3' and 4'-5') and two phase-sensitive detectors 25, 26 whose outputs are coupled to an adder 27 connected to a voltage indicator 28 of the second Hall generator 30, the inputs of said detectors being coupled to the respective outputs of supply sources 23, 24 and of an additional supply voltage shaper 32 of the second Hall generator 30. The function of the frequency selectors 33 and 34 is to select in frequency the signals obtained from across two pairs of opposite electrodes 2-3 and 4-5 of the generator 1. The function of the phase-sensitive detectors 25 and 26 is to select in frequency the signals obtained from across two pairs of opposite electrodes (2'-3', 4'-5') of the second generator 30 and to detect these signals so that the true magnitude of the voltage of cascade-connected Hall generators can be assessed from the arithmetic mean of the magnitudes of the two converted signals, obtained with the help of the adder 27.

The apparatus disclosed herein operates as follows.

When the Hall generator 1 is energized with a direct current I through one pair of opposite electrodes 2-3 which, in the starting position of the relay switch 8 (see FIG. 2b), are connected via the contacts 9, 13 and 10, 14 to the supply source 6 and while it is subjected to an unvarying magnetic induction, a Hall voltage, $e_H$, and a non-equipotentiality voltage, $U_p$, are developed across the other pair of electrodes 4-5. Assume that the two voltages have the same polarity. The voltage indicator 7 of the Hall generator 1 connected via the contacts 11, 15 and 12, 16 to the electrodes 4-5 of the generator 1, which is actually a D.C. instrument, will read an output voltage $U_1$ which is equal $U_1 = e_H + U_p$.

When the contacts of the relay switch 8 are switched by a control signal $U_y$ from the control generator 22 the electrodes 4-5 of the Hall generator 1 are connected via the contacts 9, 17 and 10, 18 to the supply source 6, while the electrodes 2-3 are connected to the voltage indicator 7 of the Hall generator 1. Owing to the fact that the Hall generator 1 is non-reciprocal for the Hall voltage, $e_H$, and reciprocal for the non-equipotentiality voltage, $U_p$, the output voltage of the generator 1 developed across the electrodes 2-3 is $U_2 = -e_H + U_p$. Since the contacts of the relay switch 8 (see FIG. 2b) are connected so as to invert the voltage $U_2$, the voltage indicator 7 of the generator 1 reads an output voltage $U_2 = e_H - U_p$.

Figure 6:
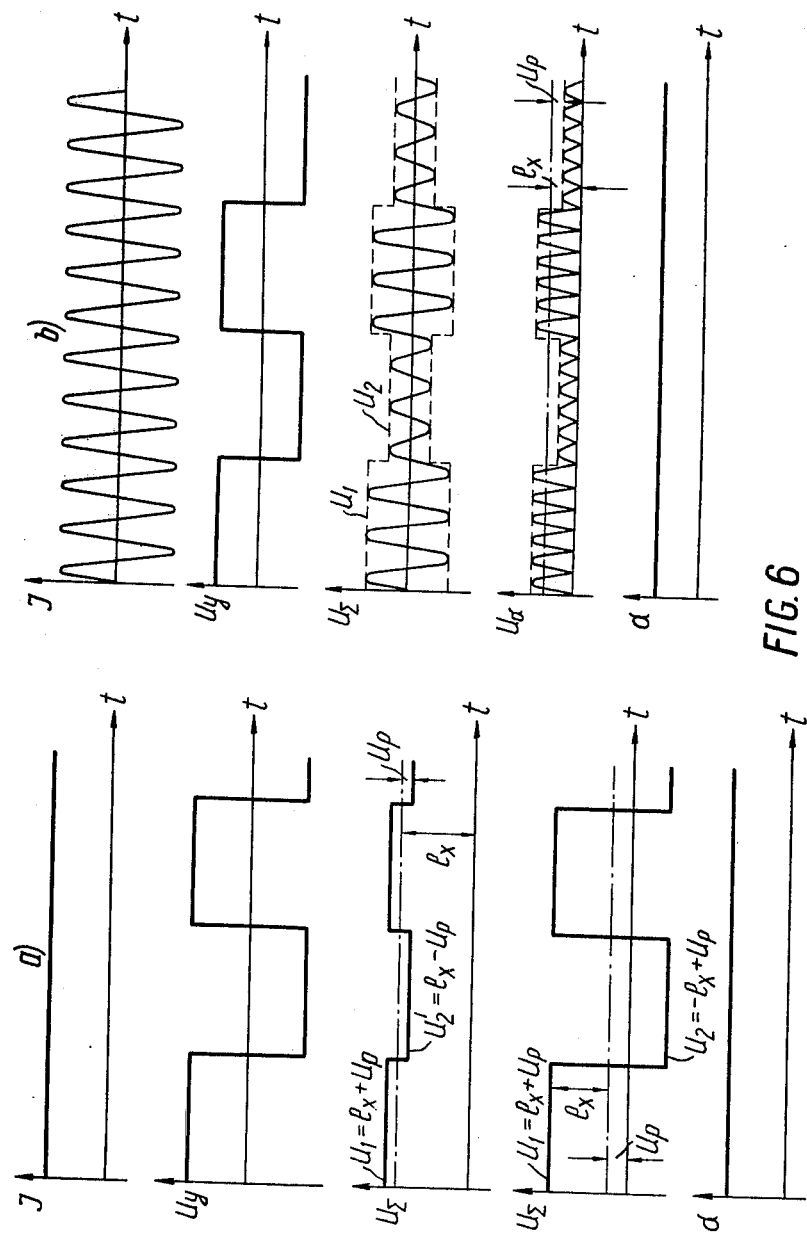
FIGS. 6a and 6b show the waveforms of currents and voltage acting in the apparatus of FIG. 2a when the Hall generator uses a direct and an alternating current, respectively, according to the invention.

If the voltage $U_y$ furnished by the control generator 22 varies at some frequency, the output voltage $U_\Sigma$ of the generator 1 obtained from across both pairs of electrodes 2-3 and 4-5 will have the waveform shown in FIG. 6a. If the voltage $U_2$ is inverted the resultant output signal $U_\Sigma$ will have a direct component proportional to the Hall voltage $e_H$ and an alternating component proportional to the non-equipotentiality voltage $U_p$. If the voltage $U_2$ is not inverted the contacts of relay switch 8 are arranged as shown in FIG. 2c. The resultant output signal $U_\Sigma$ of the generator 1 then has an alternating component proportional to the Hall voltage $e_H$ and a direct component proportional to the nonequipotentiality voltage $U_p$. Depending on the arrangement of the contacts in the relay switch 8 the indicator 7 must be either a D.C. instrument (when the voltage $U_2$ is inverted) or an A.C. instrument (when the voltage $U_2$ is not inverted).

When the Hall generator 1 is energized with an alternating current at a fixed frequency from the supply source 6 (FIG. 2a) it follows from the foregoing and from Equations 9 and 10 that switching the electrodes 2-3 and 4-5 will produce a resultant output voltage $U_\Sigma$ which is a amplitude-modulated signal (FIG. 6b) from which information can be extracted and measured by a mean-value indicator 7 (in FIG. 6b, $U_\Sigma$ is the output signal of the amplitude detector).

Thus, the deflection of the Hall-voltage indicator 7 4-5 will produce a resultant output voltage $U_\Sigma$ which is a amplitude-modulated signal (FIG. 6b) from which information can be extracted and measured by a mean-value indicator 7 (in FIG. 6b, $U\alpha$ is the output signal of the amplitude detector).

Thus, the deflection of the Hall-voltage indicator 7 through an angle $\alpha$ in the cases discussed above is proportional to the arithmetic mean of the magnitudes of the output signals obtained from across each pair of opposite electrodes, i.e. to the Hall voltage $e_H$, and is independent of the non-equipotentiality voltage $U_p$.

In the case of cascade-connected Hall generators (FIG. 4) the first Hall generator 1 energized from the source 6 through the relay switch 8 operates similarly to the above-mentioned single Hall generator with the same switch. The output signal $U_{\Sigma 1}$ obtained from across the opposite pairs of electrodes 2-3 and 4-5 of the Hall generator 1 is fed to the second Hall generator 30 through an additional switch 31, which operate similarly to the generator 1 and the relay switch 8. The switches 8 and 31 are controlled by the generator 22. The indicator 7 reads the output voltage of the second Hall generator 30.

When the first Hall generator 1 is energized with a direct current I in the presence of magnetic induction the output signal $U_{\Sigma 1}$ of the first Hall generator 1 is $U_{\Sigma 1} = e_{H1} \pm U_{p1}$ if the output voltage of the first generator 1 is inverted or is $U_{\Sigma 1} = U_{p1} \pm e_{H1}$ if the output voltage of the first generator 1 is not inverted, with the electrodes of the Hall generator 1 switched over. In the first case the second Hall generator 30 is energized with a direct component of the resultant output voltage $U_{\Sigma 1}$ of the first Hall generator 1, in the second case, with an alternating component of the resultant output voltage $U_{\Sigma 1}$, which are proportional to the Hall voltage $e_{H1}$ of the first generator 1. The output voltage $U_{\Sigma 2}$ of the second Hall generator 30 is $U_{\Sigma 2} = ke_{H1} \pm U_{p2}$ if the output voltage of the second Hall generator 30 is inverted and is $U_{\Sigma 2} = U_{p2} \pm ke_{H1}$ if the output voltage of the second Hall generator 30 is not inverted, with the electrodes of the second Hall generator 30 switched over. In the former case the resultant output signal $U_{\Sigma 2}$ has a direct component proportional to the Hall voltage of the second generator 30, $e_{H2} = ke_{H1}$, and an alternating component proportional to the non-equipotentiality voltage, $U_{p2}$, of the second generator 30.

In the latter case the resultant output signal $U_{\Sigma 2}$ has an alternating component proportional to the Hall voltage, $e_{H2}$, of the second generator 30 and a direct component proportional to the non-equipotentiality voltage, $U_{p2}$, of the second generator 30. Depending on the arrangement of contacts in the additional switch 31 the indicator 7 must be a D.C. instrument (if the voltage of the second generator 30 is inverted when the contacts of the additional switch 31 switch over), or an A.C. instrument (if the voltage of the output generator 30 is not inverted when the contacts of the additional switch 31 switch over).

When the generator 1 is energized with an alternating current at a fixed frequency from the supply source 6 (FIG. 4) it follows from the foregoing and from equations 9, 10 that when the electrodes of the Hall generators 1, 30 are switched over, the resultant output voltage of the second Hall generator 30 is an amplitude-modulated signal from which information can be extracted and measured by a mean value indicator 7.

Thus the deflection of the indicator 7 showing the voltage of the cascade-connected Hall generators 1 and 30 through an angle $\alpha$ in the cases discussed above is proportional to the arithmetic mean of the magnitudes of the output signals obtained from across each pair of opposite electrodes of the second Hall generator 30, i.e. to the Hall voltage $e_{H2}$ and is independent on the non-equipotentiality voltages $U_{p1}$ and $U_{p2}$.

When the Hall generator 1 is energized from two A.C. sources 23 and 24 operating at frequencies of which one is an even multiple of the other, and is subjected to an unvarying magnetic induction the voltages $U_1$ and $U_2$ appear across each pair of opposite electrodes 2-3 and 4-5, each voltage comprising two components differing in frequency. One component is due to the Hall voltage $e_H$ and the non-equipotentiality voltage, and the other is due to the voltage drop across the generator 1 caused by the flow of the supply current. The electrodes 2-3 of the Hall generator 1 are connected to the source 23 of current at a frequency $\omega$, and the electrodes 4-5, to the source 24 of current at a frequency $2n\omega$. The voltage $U_1$ developed across the electrodes 2-3 is applied to the input of the phase-sensitive detector 25. The reference voltage is derived from the source 24. The voltage $U_2$ developed across the electrodes 4-5 is applied to the input of the phase-sensitive detector 26, with a reference voltage derived from the source 23. Owing to the selectivity of the phase-sensitive detectors 25 and 26 the direct voltages $U_3$ and $U_4$ appearing across their outputs are independent of the voltage drops across the generator 1 due to the supply currents $i_1$ and $i_2$. Since for the Hall voltage $e_H$ the generator 1 is a non-reciprocal circuit, and for the non-equipotentiality voltage $U_p$ it is a reciprocal circuit, the direct component of the voltage across the output of the phase-sensitive detector 25 is proportional to the sum of the Hall voltage $e_H$ and the non-equipotentiality voltage $U_p$, while the direct component across the output of the phase-sensitive detector 26 is equal to the difference between these two voltages. Then, if the two phase-sensitive detectors have the same transmission gain, the voltage $U_5$ across the output of the adder 27 will be proportional to the Hall voltage $e_H$ and independent of the non-equipotentiality voltage. The indicator 28 will read the true magnitude of the Hall voltage.

For better separation of the output signals of the generator 1 selective (tuned) amplifiers (not shown in FIG. 3) may be placed between the phase-sensitive detectors 25, 26 and the respective pairs of opposite electrodes 2-3 and 4-5 of the generator 1.

In the case of two-cascade-connected Hall generators (FIG. 5) when the first Hall generator 1 is energized from two A.C. sources 23 and 24 operating at frequencies of which one is an even multiple of the other, each pair of opposite electrodes will develop voltages which have two components differing in frequency. The components of each pair of electrodes 2-3, 4-5 of the generator 1 which are independent of the supply currents $i_1$ and $i_2$ are separated by the frequency selectors 33, 34 and fed to the additional supply voltage shaper 32 of the second generator 30. The second Hall generator 30 energized from the shaper 32 with two alternating voltages at the frequencies of which one is an even multiple of the other, the phase-sensitive detectors 25, 26 and the adder 27 operate in exactly the same manner as the apparatus of FIG. 3 which has one Hall generator 1. The output voltage of the adder 27 is proportional to the Hall voltage $e_{H2}$ of the second generator and is independent of the non-equipotentiality voltages $U_{p1}$ and $U_{p2}$ of the generator. The indicator 28 reads the true magnitude of the Hall voltage of the second generator.

Thus, the invention disclosed herein as compared with prior-art apparatuses completely eliminates the effect of the non-equipotentiality voltage on the Hall voltage of one Hall generator or on the Hall voltage of cascade-connected Hall generators, with the result that the time required for measurement or registration is drastically reduced, the accuracy and the sensitivity of all devices incorporating Hall generators is enhanced, a means is provided for determining the absolute value of magnetic induction within a given space the operations involved in the measurement or registration can be automated and the Hall generator may successfully be employed in digital instruments.

What we claim is:

1. A method of eliminating the effect of a non-equipotentiality voltage on the voltage of a Hall generator, wherein a Hall generator, serving to measure and convert magnetic induction and comprising two pairs of opposite electrodes: the first and second pair, is fed with current through the first of said pairs of electrodes whereas the output signal is obtained from across the second of said pair of electrodes and, simultaneously, said generator is fed with current equal in magnitude to but differing in frequency from the above-mentioned current through the second of said pairs of electrodes, whereas the output signal obtained from the first of said pairs of electrodes; the output signal at the second pair of electrodes being detected at the frequency of the signal applied to the first pair of electrodes, whereas the output signal at the first pair of electrodes is detected at the frequency of the signal applied to the second pair of electrodes; the true magnitude of the Hall voltage is assessed from the arithmetic mean of the magnitudes of the two detected signals.

2. An apparatus embodying the method as claimed in claim 1 comprising a Hall generator with two pairs of opposite electrodes; a supply source for generating a current at a predetermined frequency connected to one of said pairs of opposite electrodes; an additional supply source operating at a frequency which is an even multiple of the frequency of the above-mentioned supply source and connected to the other of said pairs of opposite electrodes; at least two phase-sensitive detectors each detector being connected to a different pair of opposite electrodes, and each detector having a further input from the supply source connected to the opposite electrodes from those being detected; an adder the inputs of which are coupled to the outputs of said detectors; a Hall voltage indicator of mean value of Hall generator output signals connected to the output of said adder.

* * * * *